(12) United States Patent
Chen et al.

(10) Patent No.: US 8,110,739 B2
(45) Date of Patent: Feb. 7, 2012

(54) SOLAR CELL AND METHOD OF FABRICATING THE SAME

(75) Inventors: Miin-Jang Chen, Taipei (TW); Wen-Ching Hsu, Hsinchu (TW); Ya-Lan Ho, Jhudong Township, Hsinchu County (TW); Jung-Tsung Wang, Hsinchu (TW)

(73) Assignees: Sino-American Silicon Products, Inc., Hsinchu (TW); Miin-Jang Chen, Taipei (TW)

( * ) Notice: Subject to any disclaimer, the term of this patent is extended or adjusted under 35 U.S.C. 154(b) by 884 days.

(21) Appl. No.: 11/896,087

(22) Filed: Aug. 29, 2007

(65) Prior Publication Data

US 2008/0072959 A1 Mar. 27, 2008

(30) Foreign Application Priority Data

Sep. 27, 2006 (TW) .............................. 95135676 A

(51) Int. Cl.
*H01L 31/0216* (2006.01)
*H01L 31/0224* (2006.01)
(52) U.S. Cl. .................. 136/257; 136/256; 136/261
(58) Field of Classification Search ........... 136/243–265
See application file for complete search history.

(56) References Cited

U.S. PATENT DOCUMENTS

| | | | | |
|---|---|---|---|---|
| 4,623,601 A | * | 11/1986 | Lewis et al. | 430/69 |
| 2003/0168096 A1 | * | 9/2003 | Ouchida et al. | 136/256 |
| 2004/0060592 A1 | * | 4/2004 | Machida et al. | 136/252 |
| 2005/0056312 A1 | * | 3/2005 | Young et al. | 136/258 |
| 2005/0150543 A1 | * | 7/2005 | Nakashima et al. | 136/256 |

OTHER PUBLICATIONS

Leskela et al., Atomic layer deposition (ALD): from precursors to thin film structures, Thin Solid Films 409, pp. 138-146, Mar. 18, 2002.*
Refractive index of SiO2, Refractive Index Database, http://refractiveindex.info/?group=CRYSTALS&material=SiO2, date-unknown.*
Refractive index of ITO, Refractive Index Database, http://refractiveindex.info/?group=CRYSTALS&material=ITO, date-unknown.*
Refractive index of amorphous Si, Refractive Index Database, http://refractiveindex.info/?group=CRYSTALS&material=a-Si, date-unknown.*

* cited by examiner

*Primary Examiner* — Jessica L Ward
*Assistant Examiner* — Kevin E Yoon

(57) ABSTRACT

The invention provides a solar cell and a method of fabricating the same. The solar cell, according to a preferred embodiment of the invention, includes a semiconductor structure combination and a multi-atomic-layer structure formed of at least one oxide. The semiconductor structure combination includes at least one p-n junction and has an illuminated surface. The multi-atomic-layer structure overlays the illuminated surface of the semiconductor structure combination. In particular, the multi-atomic-layer structure serves as a surface passivation layer, a transparent conductive layer, and further as an anti-reflective layer.

10 Claims, 2 Drawing Sheets

SOLAR CELL AND METHOD OF FABRICATING THE SAME

BACKGROUND OF THE INVENTION

1. Field of the Invention

The invention relates to a solar cell and the method of fabricating the same, and more particularly, to a solar cell overlaid by a multi-atomic-layer structure formed of at least one oxide. In addition, the multi-atomic-layer structure serves as a surface passivation layer, a transparent conductive layer, and further as an anti-reflection layer.

2. Description of the Prior Art

Solar cells are extensively employed because of being capable of converting the accessible energy, emitted from a light source such as the sun, to electricity to operate electronic equipments such as calculators, computers, and heaters.

Referring to FIG. 1, FIG. 1 is a cross section view of the layered stack structure of a conventional silicon solar cell 1.

The conventional silicon solar cell 1 typically includes a p-n junction 13, placed between a p-type substrate 12 and an n-type region 14, located near an illuminated surface (front surface) 11. The term "illuminated surface" herein refers to the surface, exposed to light, of a conventional solar cell whenever it is powered or under operation. Therefore, the term "non-illuminated surface" refers to another surface opposite to the illuminated surface.

Referring to the silicon solar cell 1 in FIG. 1, the basic structure of the p-n junction 13 is formed of an intermediately-doped (about $10^{15}$ cm$^{-3}$) p-type substrate 12 and a heavily-doped (about $10^{20}$ cm$^{-3}$) n-type (n$^+$) region 14, disposed on the substrate 12 and near the illuminated surface 11. The conventional solar cell according to the commercial embodiment typically further includes a surface passivation (or textured) layer 15, formed of an oxide such as silicon dioxide, overlaying the majority of the n-type region 14, an anti-reflection layer 16 overlaying the surface passivation layer 15, an n-type metal contact layer 17 used as an electrode, a p$^+$-type region 18 overlaying a surface of the p-type substrate 12, and a p-type metal contact layer 19 overlaying a surface of the p$^+$-type region 18.

The shallow p-n junction 13 is designed to support the collection of electrons and holes generated on both sides of the p-n junction 13. Each photon of the light penetrates into and is absorbed by the silicon substrate 12, for transferring its energy to an electron in a bound state (covalent bond) and thereby releasing a bound electron to be a free one. This movable electron and the hole (which is also movable) left behind by the former in the covalent bond include a potential element of the current flowing from the solar cell. In order to contribute to the current, the electron and hole cannot recombine but rather are separated by the electric field associated with the p-n junction 13. If the separation occurs, the electron will travel to the n-type metal contact layer 17, and the hole will travel to the p-type metal contact layer 19.

With the development of the silicon solar cell, the structure thereof generating electro-optic effect continues to be investigated such as the multi-junction technique. A variety of the structures related to electro-optic effect inside the silicon solar cell will not be described redundantly here. What is described is only the process of fabricating the surface passivation layer, the anti-reflection layer, and the electrode (which contacts the silicon on the illuminated surface), which is obviously a complicated process.

Accordingly, a scope of the invention is to utilize a multi-atomic-layer structure inside the solar cell. In addition, the multi-atomic-layer structure serves as a surface passivation layer, a transparent conductive layer, and further as an anti-reflection layer. In particular, compared to the prior art, the manufacturing process of the multi-atomic-layer structure is simpler.

Moreover, with the development of the thin film silicon solar cell, the processes, forming each layer inside the thin film silicon solar cell, must lower the possibility of the thermal impact and thermal crack induced on the thin film silicon solar cell to enhance the yield rate.

Accordingly, another scope of the invention relates to a manufacturing process of a solar cell, particularly a thin film solar cell, with the formation of a surface passivation layer, a transparent conductive layer, and further as an anti-reflection layer, in which thermal impact will not occur on the solar cell.

SUMMARY OF THE INVENTION

The solar cell according to a preferred embodiment of the invention includes a semiconductor structure combination and a multi-atomic-layer structure formed of at least one oxide. The semiconductor structure combination includes at least one p-n junction and has an illuminated surface. The multi-atomic-layer structure overlays the illuminated surface of the semiconductor structure combination. In particular, the multi-atomic-layer structure serves as a surface passivation layer, a transparent conductive layer, and further as an anti-reflection layer.

A method of fabricating the solar cell according to a preferred embodiment of the invention forms a semiconductor structure combination first. The semiconductor structure combination includes at least one p-n junction and has an illuminated surface. Then, the method forms a multi-atomic-layer structure formed of at least one oxide. The multi-atomic-layer structure overlays the illuminated surface of the semiconductor structure combination. In particular, the multi-atomic-layer structure serves as a surface passivation layer, a transparent conductive layer, and further as an anti-reflection layer.

The advantage and spirit of the invention may be understood by the following recitations together with the appended drawings.

BRIEF DESCRIPTION OF THE APPENDED DRAWINGS

DETAILED DESCRIPTION OF THE INVENTION

The invention provides a solar cell and the method of fabricating the same, and more particularly, the solar cell according to the invention is overlaid by a multi-atomic-layer structure formed of at least one oxide. The multi-atomic-layer structure serves as a surface passivation layer, a transparent conductive layer, and further as an anti-reflection layer. The multi-atomic-layer structure is formed by an atomic layer deposition process performing at lower temperature. Therefore, the manufacturing process of the multi-atomic-layer structure is simpler and does not have thermal impact and thermal crack on the silicon solar cell. The preferred embodiment of the invention is disclosed as follows.

Figure 1:
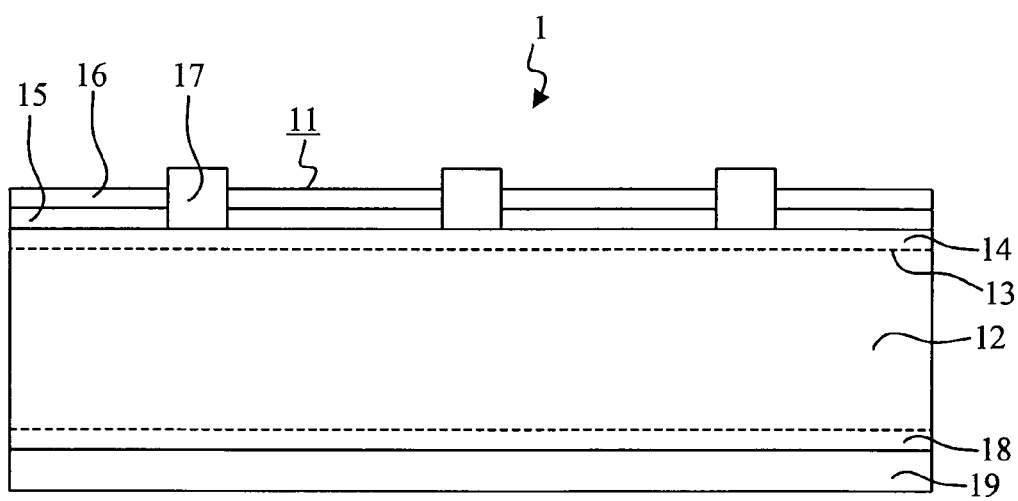
FIG. 1 is a cross section view of a conventional silicon solar cell.
Figure 2:
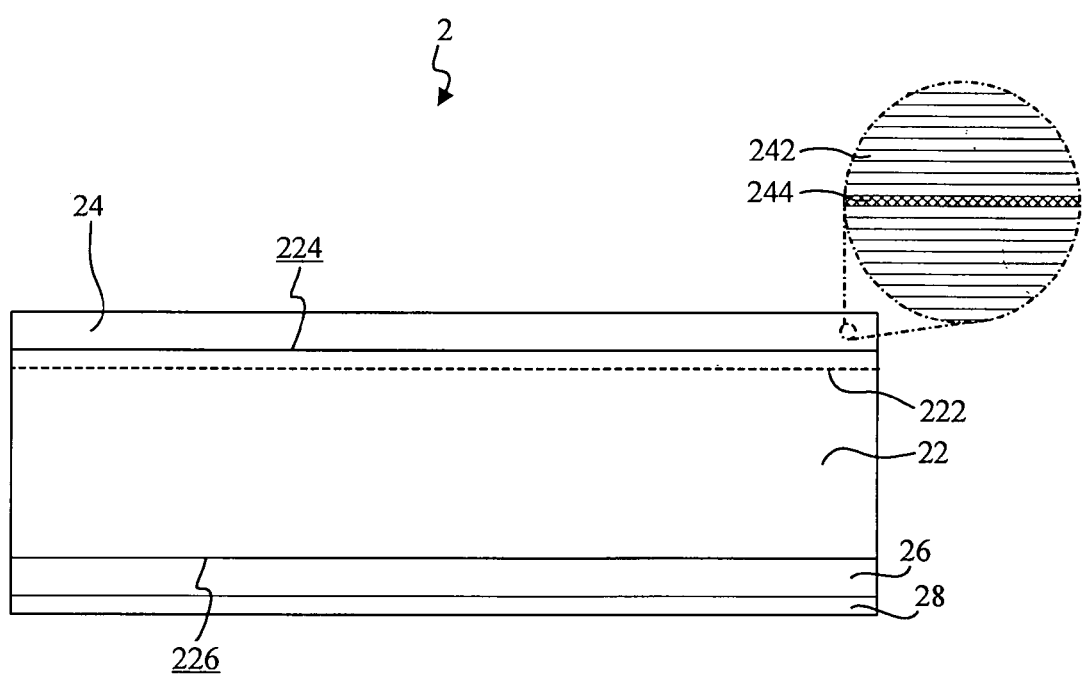
FIG. 2 is a cross section view illustrating the solar cell according to a preferred embodiment of the invention.

Referring to FIG. 2, FIG. 2 is a cross section view illustrating the solar cell 2 according to a preferred embodiment of the invention. The solar cell 2 includes a semiconductor structure combination 22 and a multi-atomic-layer structure 24 formed of at least one oxide. The semiconductor structure combination 22 includes at least one p-n junction 222 and has an illuminated surface 224. FIG. 2 schematically illustrates one p-n junction 222.

In one embodiment, the illuminated surface 224 of the semiconductor structure combination 22 is treated by a surface texturing treatment to decrease the reflectivity of the incident light to below 1%.

In one embodiment, the semiconductor structure combination 22 also includes a silicon substrate; namely, the solar cell 2 is a silicon solar cell. If the solar cell 2 is a thin film silicon solar cell, the preferred thickness of the silicon substrate is equal to or smaller than 300 micrometer.

Referring to FIG. 2, the multi-atomic-layer structure 24 overlays the illuminated surface 224 of the semiconductor structure combination 22. In particular, the multi-atomic-layer structure serves as a surface passivation layer and a transparent conductive layer.

In one embodiment, the at least one oxide includes an aluminum oxide. In the embodiment, the aluminum oxide, formed inside the multi-atomic-layer structure 24 by a first atomic layer deposition process performing at a processing temperature ranging from room temperature to 400° C., overlays the illuminated surface 224 of the semiconductor structure combination 22 to provide the function of the surface passivation layer. The preferred thickness of the thin film aluminum oxide provided for the function of the surface passivation layer is about 1 nm to 10 nm. The atomic layer deposition process adopted by the invention also has the following advantages: (1) able to control the formation of the material in nano-metric scale; (2) able to control the film thickness more precisely; (3) able to have large-area production; (4) having excellent uniformity; (5) having excellent conformality; (6) pinhole-free structure; (7) having low defect density; and (8) low deposition temperature, etc.

In one embodiment, the precursors of the aluminum oxide in the first atomic layer deposition process are a TMA (Trimethylaluminum) and an $H_2O$ or an $O_3$, where Al is from TMA, and O is from $H_2O$ or $O_3$.

In one embodiment, the at least one oxide also includes a zinc oxide. In other words, the multi-atomic-layer structure 24 includes the zinc oxide layer existing in a form of N atomic layers, as shown by the mark 242 in FIG. 2, so as to provide the function of the transparent conductive layer.

In the above-mentioned embodiment, the zinc oxide is formed inside the multi-atomic-layer structure 24 by a second atomic layer deposition process performing at a processing temperature: ranging from room temperature to 400° C.

In the above-mentioned embodiment, the precursors of the zinc oxide in the second atomic layer deposition process are a DEZn (Diethylzinc) and a $H_2O$ or an $O_3$, where Zn is from DEZn, and O is from $H_2O$ or $O_3$.

Taking the zinc oxide atomic layer deposition as an example, an atomic layer deposition cycle includes four reaction steps of:

1. Using a carrier gas to carry $H_2O$ molecules into the reaction chamber, thereby the $H_2O$ molecules are absorbed on a surface of the substrate to form a layer of OH radicals, where the exposure period is 0.1 second;
2. Using a carrier gas to purge the $H_2O$ molecules not absorbed on the surface of the substrate, where the purge time is 5 seconds;
3. Using a carrier gas to carry DEZn molecules into the reaction chamber, thereby the DEZn molecules react with the OH radicals absorbed on the surface of the substrate to form one monolayer of ZnO, wherein a by-product is organic molecules, where the exposure period is 0.1 second; and
4. Using a carrier gas to purge the residual DEZn molecules and the by-product due to the reaction, where the purge time is 5 seconds.

The carrier gas can be highly-pure argon or nitrogen. The above four steps, called one cycle of the atomic layer deposition, grows a thin film with single-atomic-layer thickness on the whole area of the substrate. The property is called self-limiting capable of controlling the film thickness with a precision of one atomic layer in the atomic layer deposition. Thus, controlling the number of cycles of atomic layer deposition can precisely control the thickness of the zinc oxide.

In one embodiment, in order to enhance the conductivity of the zinc oxide layer, aluminum oxides are inserted into zinc oxide layer by atomic layer deposition. In other words, the aluminum oxide exists in a form of N atomic layers inside the multi-atomic-layer structure 24, where N is a natural number. FIG. 2 only illustrates the case of the aluminum oxide formed of one atomic layer, where the mark 244 represents the aluminum oxide layer. Referring to the case illustrated in FIG. 2, the single aluminum oxide atomic layer is formed alternately in the process of forming dozens (or hundreds) of zinc oxide layers. Therefore, the multi-atomic-layer structure 24, substantially formed of the zinc oxide, is considered practically the aluminum doped zinc oxide (ZnO:Al) layer to enhance the conductivity of the zinc oxide layer. Compared to another common transparent conductive oxide ITO, the ZnO:Al transparent conductive thin film fabricated by atomic layer deposition has the conductivity comparable to the commercial ITO, a transparency higher than 80%, and a deposition temperature ranging from room temperature to 400° C. Consequently, the atomic layer deposition technique is highly compatible with the thin silicon wafer, which is not resistant to high-temperature manufacturing process. Moreover, zinc oxide is cheaper and more abundant.

For the silicon wafer without anti-reflection layer, the reflectivity of the incident light on the surface of the silicon wafer is about 30~35%. Surface texturing can contribute to at least double reflection of the incident light to decrease the reflectivity to below 10%. The reflectivity can be decreased to below 1% if an anti-reflection layer is added on the surface. For the anti-reflection layer to attain the smallest reflective coefficient, some conditions must be satisfied as follows:

$$n = \sqrt{n_0 n_s} ; \qquad \text{formula 1}$$

and $$nd = \frac{m}{4}\lambda_0 \quad m = 1, 2, 3 \ldots ; \qquad \text{formula 2}$$

where n, $n_0$, and $n_s$ are the refractive index of the anti-reflection layer, air, and substrate, respectively; d is the thickness of the anti-reflection layer, and $\lambda_0$ is the wavelength of the incident light. It is very essential to precisely control the refractive index and thickness of the anti-reflection layer for substantially decreasing the reflectivity.

In the control of thickness, because the atomic layer deposition is capable of precisely controlling the film thickness, the optimum thickness of the anti-reflection layer is facile. For the solar cell with silicon wafer as the substrate, the required refractive index of anti-reflection layer is 1.95 to obtain the lowest reflectivity at the wavelength of 550 nm. The atomic layer deposition technique can be employed to prepare the anti-reflection layer with a refractive index of 1.95. The layers with high and low refractive index materials are deposited alternately by atomic layer deposition. Because the wavelength of the light is substantially longer than the thickness of each layer, the intermixed structure is viewed as a unit and considered as a material having specific refractive index.

The experiments have proved that the ZnO:Al has the lowest resistance when the Al content ([Al/(Al+Zn)]×100%) is 0~5%. Coincidentally, at this time, the refractive index of the ZnO:Al is very close to 1.95, which is also the required refractive index meeting the condition of the lowest reflectivity. At this time, if the thickness of the ZnO:Al transparent conductive film is controlled to be the an odd-numbered multiple of a quarter of the wavelength of the incident light, the multi-atomic-layer structure 24 can serve as an anti-reflection layer and can decrease the reflectivity of the incident light to below 1%.

Moreover, referring to FIG. 2, the solar cell 2 may also have a transparent conductive layer 26, disposed on the surface 226 opposite to the illuminated surface 224 and overlaying the surface 226. Referring to FIG. 2, the solar cell 2 further includes a back-reflector 28 (for example, an Ag or Al layer) overlaying the transparent conductive layer 26. In one embodiment, the transparent conductive layer 26 is another multi-atomic-layer structure formed of the above-mentioned oxides, such as ZnO:Al. In this case, the ZnO:Al transparent conductive material can decrease the optical adsorption of the metal electrode and can enhance the reflectivity of the long-wavelength light that has not been absorbed. Moreover, the transparent conductive layer 26, utilizing the ZnO:Al transparent conductive material, has advantages in the manufacturing process of forming the multi-atomic-layer structure 24 and the transparent conductive layer 26 simultaneously. The advantage is beneficial to the batch-type production of solar cell 2.

A method of fabricating the solar cell according to a preferred embodiment of the invention first forms a semiconductor structure combination. The semiconductor structure combination includes at least one p-n junction and has an illuminated surface.

Then, the method according to the invention continues to form an atomic layer formed of one oxide on the illuminated surface of the semiconductor structure combination, and it further forms a multi-atomic-layer structure overlaying the illuminated surface of the semiconductor structure combination. The multi-atomic-layer structure serves as a surface passivation layer and a transparent conductive layer.

In one embodiment, the illuminated surface of the semiconductor structure combination is treated by a surface texturing treatment.

In one embodiment, the at least one oxide includes an aluminum oxide. In the embodiment, the aluminum oxide, formed inside the multi-atomic-layer structure by a first atomic layer deposition process performing at a processing temperature ranging from room temperature to 400° C., overlays the illuminated surface of the semiconductor structure combination, so as to provide the function of the surface passivation layer. The preferred thickness of the thin film aluminum oxide provided for the function of the surface passivation layer is about 1 nm to 10 nm. In the embodiment, the precursors of the aluminum oxide in the first atomic layer deposition process are a TMA and an $H_2O$ or an $O_3$, where Al is from TMA, and O is from $H_2O$ or $O_3$.

In one embodiment, the at least one oxide includes a zinc oxide. In other words, the multi-atomic-layer structure includes the zinc oxide layer existing in a form of N atomic layers to provide the function of the transparent conductive layer. In the embodiment, the zinc oxide is formed inside the multi-atomic-layer structure by a second atomic layer deposition process performing at a processing temperature ranging from room temperature to 400° C.

In the above-mentioned embodiment, the precursors of the zinc oxide in the second atomic layer deposition process are a DEZn and an $H_2O$ or an $O_3$, where Zn is from DEZn, and O is from $H_2O$ or $O_3$.

In order to enhance the conductivity of the multi-atomic-layer structure substantially formed of the zinc oxide, N aluminum oxide atomic layers are further formed alternately in the process of forming dozens (or hundreds) of the zinc oxide layers, where N is a natural number. Therefore, the multi-atomic-layer structure, substantially formed of the zinc oxide, is considered practically the ZnO:Al layer to enhance the conductivity of the zinc oxide layer. The ZnO:Al transparent conductive thin film has the lowest resistivity when the Al content ([Al/(Al+Zn)]×100%) thereof is controlled to be 0~5%. Moreover, the refractive index of the ZnO:Al is very close to 1.95. At this time, if the thickness of the ZnO:Al transparent conductive film is controlled to be an odd-numbered multiple of a quarter of the wavelength of the incident light, the multi-atomic-layer structure can serve as an anti-reflection layer and decrease the reflectivity of the incident light to below 1%.

Because the zinc oxide and aluminum oxide layers are both formed by the atomic layer deposition process, the semiconductor structure combination is fabricated and then disposed into a reaction chamber designed for an atomic layer deposition process. The processes of forming the multi-atomic-layer structure, serving as a surface passivation layer, a transparent conductive layer, and as an anti-reflection layer, are finished in single reaction chamber. Furthermore, the processes of forming the multiple zinc oxide atomic layers and alternative aluminum oxide atomic layers are included in the reaction chamber.

Moreover, if the atomic layer deposition process performs at a processing temperature ranging from room temperature to 400° C., the semiconductor structure combination will not be subjected to thermal impact and thermal crack during the process of forming the multi-atomic-layer. Obviously, it is quite beneficial for the method according to the invention to be applied to the manufacture of the thin film solar cell.

In one embodiment, the method according to the invention further forms a transparent conductive layer on the surface opposite to the illuminated surface of the semiconductor structure combination. Furthermore, the method according to the invention forms a back-reflector on a surface of the transparent conductive layer. The transparent conductive layer can be another multi-atomic-layer structure formed of the above-mentioned oxides, such as ZnO:Al.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A solar cell, comprising:
  a semiconductor structure combination comprising at least one p-n junction and having an illuminated surface; and
  a first transparent conductive layer of a first oxide formed on the illuminated surface of the semiconductor structure combination, the first transparent conductive layer having a thickness and being doped with a second oxide, which is a single atomic-layer embedded in the first transparent conductive layer, such that the first transparent conductive layer obtains the lowest reflectivity at a wavelength of a sunlight.

2. The solar cell of claim 1, wherein the semiconductor structure combination comprises a silicon layer of a conductive type which provides the illuminated surface, the first transparent conductive layer also serves as a first surface passivation layer for the silicon layer of the conductive type.

3. The solar cell of claim 2, wherein the first oxide is zinc oxide, and the second oxide is aluminum oxide.

4. The solar cell of claim 3, wherein the first transparent conductive layer has a refractive index of 1.95 to obtain the lowest reflectivity at the wavelength of 550 nm of the sunlight.

5. The solar cell of claim 3, wherein the illuminated surface of the semiconductor structure combination is a textured surface.

6. The solar cell of claim 2, wherein the semiconductor structure combination comprises a silicon substrate.

7. The solar cell of claim 2, wherein the semiconductor structure combination substrate also has a lower surface opposite to the illuminated surface, said solar cell further comprises a second transparent conductive of the first oxide formed on the lower surface of the semiconductor structure combination, and the second transparent conductive layer is doped with the second oxide in the single-atomic-layer form.

8. The solar cell of claim 7, wherein the second transparent conductive layer also serves as a second surface passivation layer for the silicon substrate.

9. The solar cell of claim 7, further comprising a back reflector formed on the second transparent conductive layer.

10. The solar cell of claim 7, wherein the first oxide is zinc oxide, and the second oxide is aluminum oxide.

* * * * *